(12) United States Patent
Herzberg

(10) Patent No.: US 6,937,846 B1
(45) Date of Patent: Aug. 30, 2005

(54) PIN DIODE CIRCUIT ARRANGEMENT

(75) Inventor: Ralf Herzberg, Toenisvorst (DE)

(73) Assignee: Siemens Aktiengesellschaft, Munich (DE)

( * ) Notice: Subject to any disclaimer, the term of this patent is extended or adjusted under 35 U.S.C. 154(b) by 408 days.

(21) Appl. No.: 10/129,768

(22) PCT Filed: Nov. 8, 2000

(86) PCT No.: PCT/DE00/03906

§ 371 (c)(1),
(2), (4) Date: May 8, 2002

(87) PCT Pub. No.: WO01/35530

PCT Pub. Date: May 17, 2001

(30) Foreign Application Priority Data

Nov. 9, 1999 (DE) ................................. 199 53 872

(51) Int. Cl.[7] .............................................. H04B 1/44
(52) U.S. Cl. .................... 455/83; 455/78; 455/127.1; 455/191.3; 455/191.2; 455/249.1; 324/318; 324/322; 324/308; 330/284; 330/51; 333/81 R; 333/103; 333/262; 333/101; 311/117 R; 311/179; 311/177 V
(58) Field of Search ................. 455/83, 78, 127.1, 455/191.2, 191.3, 108, 82; 330/284, 51; 324/318, 324/322

(56) References Cited

U.S. PATENT DOCUMENTS

| | | | | |
|---|---|---|---|---|
| 5,440,283 A | * | 8/1995 | Nendza | 333/262 |
| 5,565,823 A | * | 10/1996 | Fratti | 333/81 R |
| 5,634,200 A | | 5/1997 | Kitakubo et al. | |
| 5,898,911 A | * | 4/1999 | White | 455/232.1 |
| 5,911,116 A | * | 6/1999 | Nosswitz | 455/83 |
| 5,914,634 A | * | 6/1999 | Oberhammer | 327/560 |
| 5,923,233 A | * | 7/1999 | Jantunen et al. | 333/235 |
| 6,154,082 A | * | 11/2000 | Bernard et al. | 327/310 |
| 6,198,288 B1 | * | 3/2001 | Gauss et al. | 324/322 |
| 6,218,909 B1 | * | 4/2001 | Eban | 331/117 R |

FOREIGN PATENT DOCUMENTS

EP 0 578 160 1/1994

OTHER PUBLICATIONS

Hammes: "RF High Power Switch with Reverse Biased Pin-Diodes" Motorola Technical Developments, Oct. 1, 1994, pp. 32-33.

* cited by examiner

Primary Examiner—Marceau Milord
(74) Attorney, Agent, or Firm—Bell, Boyd & Lloyd LLC

(57) ABSTRACT

A PIN diode switching system is provided, particularly for the transmission stage of a mobile radio telephone, in which, when the PIN diode switching system is in a reverse-bias state, a PIN diode is isolated from its power supply via a high-impedance switch and is, thus, biased by its self-rectification to a radio-frequency voltage in order to suppress harmonic formation and radio-frequency attenuation.

10 Claims, 2 Drawing Sheets

PIN DIODE CIRCUIT ARRANGEMENT

BACKGROUND OF THE INVENTION

The present invention relates to a PIN diode switching system; in particular, incorporated in the transmission stage of a mobile radio telephone or in the form of a changeover switch for switching the antenna between transmission and reception.

In the radio-frequency band, PIN diodes are used as a controllable resistance for attenuation purposes, and as low-loss switches. PIN diodes are used in the radio-frequency field owing to the small diode dimensions, the low insertion inductance and the low blocking capacity.

As is known, when PIN-diodes which have to switch high radio-frequency power levels (RF switches) are in the reverse-biased state, they must be biased with a negative reverse voltage whose magnitude is at least as great as that of the radio-frequency voltage (peak voltage) to be switched, in order to avoid signal distortion, harmonic formation and radio-frequency attenuation. For example, a 14 V biased voltage is required in order to switch 2 watts of RF power in a mobile radio telephone with a 3.6 V supply voltage.

Until now, conventional DC voltage converters such as switched-mode converters or charge pumps (switched capacitors) have been used to produce the necessary negative reverse voltage.

The production of the relatively high negative voltage using the DC voltage converter, especially for battery-powered appliances, is associated with a high level of complexity and with high costs, while the auxiliary power which is supplied to the DC voltage converter furthermore reduces the operating time of a battery-powered appliance.

Furthermore, the voltage converter in a circuit arrangement occupies a considerable amount of space in comparison to the dimensions of present-day electronic appliances and, in particular, mobile radio telephones, which runs counter to the trend and the economic necessity to construct more convenient mobile radio telephones of smaller size.

An object of the present invention is, thus, to develop a novel and effective circuit arrangement of this generic type, which can be produced cost-effectively and without major effort.

SUMMARY OF THE INVENTION

The present invention includes the essential idea of suppressing the (rectification) flow and the harmonic formation and radio-frequency attenuation associated with it from a PIN diode connected in parallel with the signal path, and of isolating the PIN diode, when it is reverse-biased, from its power supply via a high-impedance switch. In this case, the PIN diode uses its own self-rectification to bias the radio-frequency peak voltage without any externally supplied negative bias voltage being required. The unreliable signal distortion, therefore, cannot occur. Furthermore, harmonic formation and radio-frequency attenuation are suppressed. The solution according to the present invention avoids the use of a voltage converter, which is associated with a high level of complexity, high costs and, not least, a considerable space requirement.

An ideal PIN diode operates like a variable resistor, which is controlled by direct current. A real PIN diode also has non-linear characteristics which are dependent on the frequency and amplitude of the applied signal: at high signal levels (that is to say, when the diode is reverse-biased), the PIN diode rectifies a portion of the applied signal voltage. A rectified current now flows if a DC path now exists (for example, via the BIAS circuit) for the reverse-biased PIN diode. This leads firstly to harmonic formation in the signal voltage and, since the rectified current is in the forward direction for the PIN diode, to a reduction in the PIN diode resistance and, hence, to increased radio-frequency attenuation. The solution according the present invention includes the high-impedance interruption of the DC path described above (in contrast to the active bias voltage for the reverse-biased diode in previous solutions) and the "storage" of the negative peak voltage, produced by the PIN diode, in the block capacitor C of the RF inductor-capacitor unit (L and C).

In order to give the bias resistance as high an impedance as possible when the PIN diode is in the "OFF" state, a high-impedance switch is connected to the voltage supply.

A bipolar transistor is preferably used as a high-impedance switch of this type, although field-effect transistors and MOSFETs also may be used, provided that their residual currents are small enough.

Additional features and advantages of the present invention are described in, and will be apparent from, the following Detailed Description of the Invention and the Figures.

DETAILED DESCRIPTION OF THE INVENTION

Figure 1:
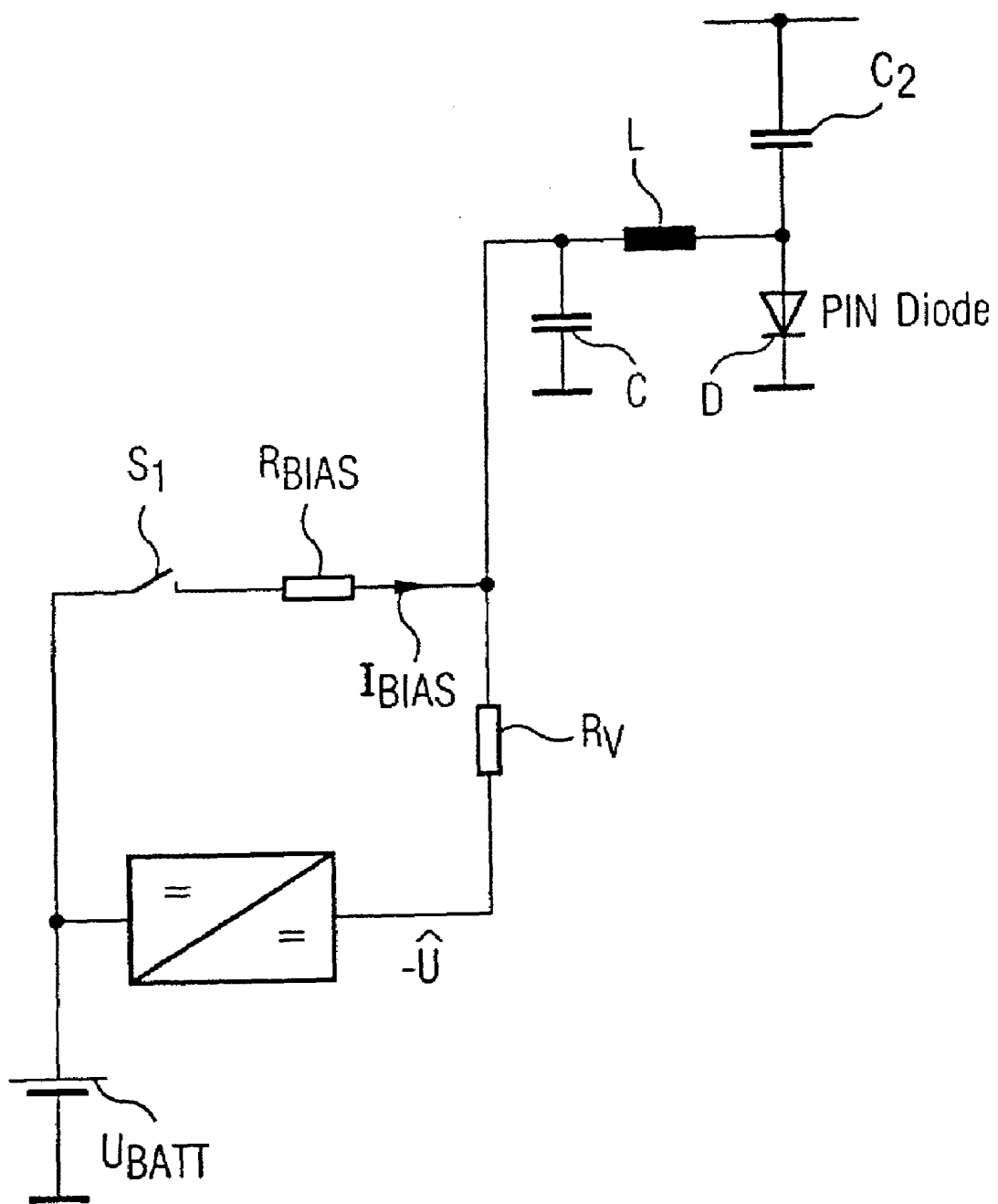
FIG. 1 shows a circuit extract from a PIN diode drive according to the prior art.

FIG. 1 shows a normal PIN diode drive, in which a diode D is used a "Shunt" switch and, for RF purposes, the PIN diode D is connected in parallel with the signal path. While the switch S is OFF, the diode D receives negative reverse voltage -ū, which is produced by the DC voltage converter and whose magnitude is at least the same as that of the radio-frequency voltage to be switched, via the resistor Rv. The PIN diode D is then passively reverse-biased, and a negative voltage is produced. The occurrence of signal distortion is thus avoided. When the switch S1 is ON, a current $I_{BIAS}$ flows through the PIN diode, its resistance is reduced, and the signal path is short-circuited via a capacitor C2.

Figure 2:
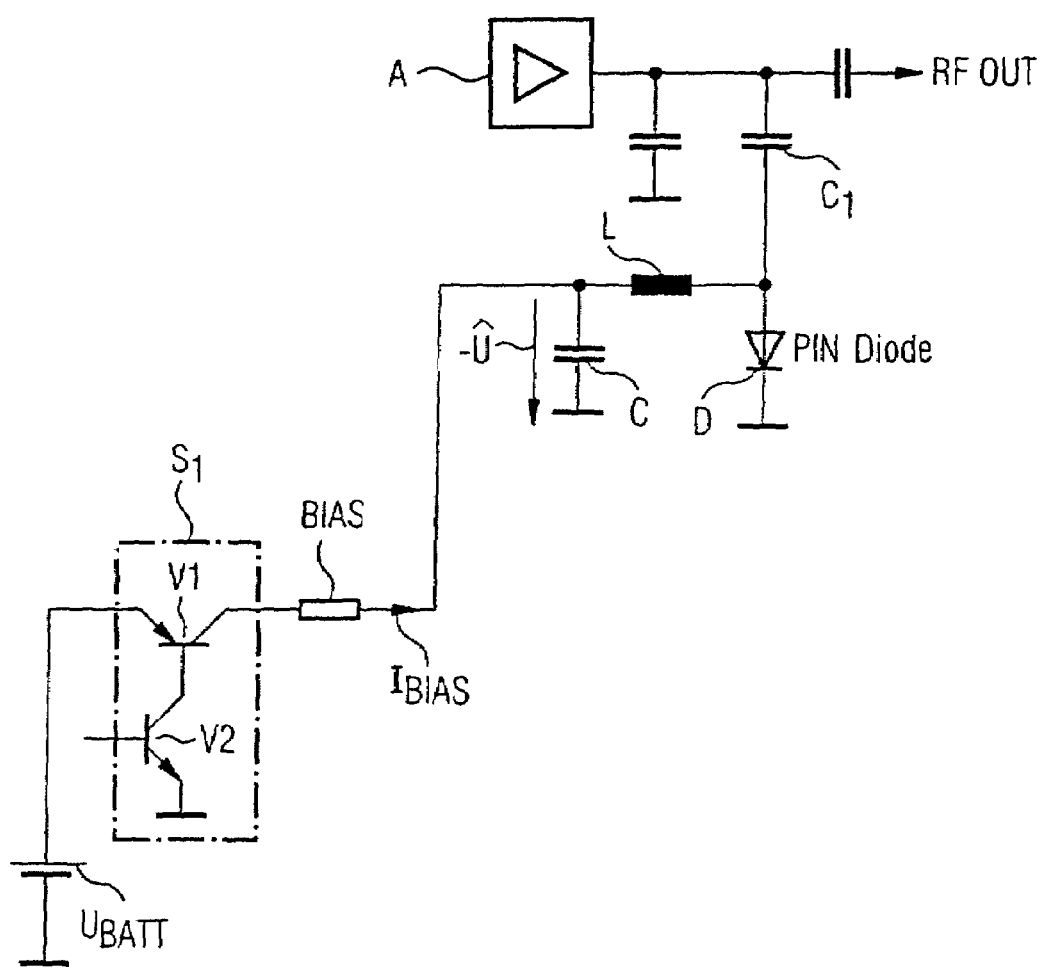
FIG. 2 shows an exemplary embodiment of the PIN diode switching system according to the present invention, in the power amplifier stage of a mobile radio telephone.

In schematic illustration which emphasizes functional components that are significant in the context of the present invention, FIG. 2 shows a power amplifier stage of a mobile radio telephone with an RF power amplifier A. A capacitor C1 is electrically connected to the output of the RF power amplifier A and in parallel with the signal path, in order to switch the matching network of the RF power amplifier to another frequency band. The PIN diode is connected in series with the capacitor C1, and its cathode K is connected to ground. A power supply $U_{BATT}$ is also provided to which the emitter side of the first transistor V1 is connected. The collector side of the first transistor V1 is connected in parallel with the PIN diode D via a passive RLC filter. The transistor V1 together with the PIN diode D thus acts as a voltage divider. A capacitor C2 is connected in parallel with a bias resistor $R_{Bias}$. The bias resistor limits the current depending on the magnitude of the operating voltage. The capacitor C2 is used as a radio-frequency block capacitor. A second transistor V2 is provided, in which the blocking current is at the same time the base current from V1, and whose emitter side is connected to ground. The second transistor V2 applies a control voltage to the base of the first transistor V1.

The PIN diode is switched on ($R_{BIAS}$ limits the current) via the switch S1, in this case in the form of a pair of bipolar transistors V1, V2, in order to connect the capacitor C1 to ground, for RF purposes. In order to exclude C1 from the signal path, only the switch S1 need be switched "OFF", according to the present invention, and no negative voltage supply is required. The PIN diode is itself biased to the negative peak value of the signal voltage û(which can be measured at C2), so that harmonic formation and radio-frequency attenuation are avoided.

Although the present invention has been described with reference to specific embodiments, those of skill in the art will recognize that changes may be made thereto without departing from the spirit and scope of the present invention as set forth in the hereafter appended claims.

What is claimed is:

1. A PIN diode switching system, comprising:
   a PIN diode; and
   a high-impedance switch, wherein, when the PIN diode is in a reverse-biased state, the high-impedance switch isolates the PIN diode from its power supply, with the PIN diode being biased by its self-rectification to a DC voltage which corresponds approximately to a negative peak value of an associated radio-frequency voltage, in order to suppress harmonic formation and radio-frequency attenuation.

2. A PIN diode switching system as claimed in claim 1, wherein the system is part of at least one of a transmission stage and a receiving stage of a mobile radio terminal.

3. A PIN diode switching system as claimed in claim 1, wherein the high-impedance switch has a bipolar transistor.

4. A PIN diode switching system as claimed in claim 1, wherein the high-impedance switch is a field-effect transistor.

5. A PIN diode switching system as claimed in claim 4, wherein the field-effect transistor is a MOSFET.

6. A PIN diode switching system as claimed in claim 1, wherein no auxiliary voltage source is provided for the PIN diode.

7. A PIN diode switching system as claimed in claim 1, further comprising a passive RLC filter provided between the high-impedance switch and the PIN diode, with a capacitor acting as a charge store for the self-rectified DC voltage from the PIN diode.

8. A mobile radio terminal, comprising:
   at least one of a transmission stage and a receiving stage; and
   a PIN diode switching system incorporated into at least one of the transmission stage and the receiving stage, the system including both a PIN diode and a high-impedance switch, wherein, when the PIN diode is in a reverse-biased state, the high impedance switch isolates the PIN diode from its power supply, with the PIN diode being biased by its self-rectification to a DC voltage which corresponds approximately to a negative peak value of an associated radio-frequency voltage, in order to suppress harmonic formation and radio-frequency attenuation.

9. A mobile radio terminal as claimed in claim 8, wherein the PIN diode switching system is used as a frequency band switching device for a radio-frequency power amplifier.

10. A mobile radio terminal as claimed in claim 8, wherein the PIN diode switching system is used as an antenna switching device.

* * * * *